(12) United States Patent
Chien et al.

(10) Patent No.: US 8,569,162 B2
(45) Date of Patent: Oct. 29, 2013

(54) CONDUCTIVE BUMP STRUCTURE ON SUBSTRATE AND FABRICATION METHOD THEREOF

(71) Applicant: Siliconware Precision Industries Co., Ltd., Taichung Hsien (TW)

(72) Inventors: Feng-Lung Chien, Taichung Hsien (TW); Yi-Hung Lin, Taichung Hsien (TW); Yi-Hsin Chen, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/644,006

(22) Filed: Oct. 3, 2012

(65) Prior Publication Data

US 2013/0249082 A1   Sep. 26, 2013

(30) Foreign Application Priority Data

Mar. 22, 2012 (TW) .............................. 101109805 A

(51) Int. Cl.
   *H01L 21/44* (2006.01)
(52) U.S. Cl.
   USPC ..... 438/613; 438/778; 257/738; 257/E21.508

(58) Field of Classification Search
   USPC ..................................... 257/E21.513
   See application file for complete search history.

(56) References Cited

U.S. PATENT DOCUMENTS

| | | | | |
|---|---|---|---|---|
| 5,943,597 | A * | 8/1999 | Kleffner et al. | 438/613 |
| 2006/0226542 | A1* | 10/2006 | Chien et al. | 257/737 |
| 2009/0079094 | A1* | 3/2009 | Lin | 257/778 |
| 2012/0007230 | A1* | 1/2012 | Hwang et al. | 257/737 |

* cited by examiner

*Primary Examiner* — Cheung Lee
(74) *Attorney, Agent, or Firm* — Edwards Wildman Palmer LLP; Peter F. Corless; Steven M. Jensen

(57) ABSTRACT

A conductive bump structure is formed on a substrate having a plurality of bonding pads and a first insulating layer thereon. The first insulating layer has a plurality of openings formed therein for exposing the bonding pads and a conductive post is formed on the bonding pads exposed through the openings. Therein, a gap is formed between the conductive post and the wall of the opening such that no contact occurs between the conductive post and the first insulating layer, thereby preventing delamination of the conductive bump structure caused by stresses concentrating on an interface of different materials as in the prior art.

9 Claims, 4 Drawing Sheets

CONDUCTIVE BUMP STRUCTURE ON SUBSTRATE AND FABRICATION METHOD THEREOF

CROSS-REFERENCES TO RELATED APPLICATIONS

This application claims under 35 U.S.C. §119(a) the benefit of Taiwanese Application No. 101109805, filed Mar. 22, 2012, the entire contents of which is incorporated herein by reference.

BACKGROUND OF THE INVENTION

1. Field of the Invention

The present invention relates to conductive bump structures and fabrication methods thereof, and more particularly, to a conductive bump structure on a substrate and a fabrication method thereof.

2. Description of Related Art

A flip-chip package is characterized in that a semiconductor chip is electrically connected to a packaging substrate through a plurality of solder bumps instead of using gold wires. In recent years, in order to meet the increasing demand for high-density, high-speed semiconductor elements and meet the miniaturization trend of electronic products, a flip-chip element are generally disposed on a organic circuit boards, for example, printed circuit boards, and an underfill is filled below the chips to reduce thermal stresses caused by different coefficient of thermal expansions (CIEs) of the silicon chips and the organic circuit boards.

Referring to FIG. 1A, a semiconductor chip 1 has a plurality of bonding pads 100 and a packaging substrate 4 has a plurality of conductive pads 40 corresponding to the bonding pads 100, respectively. By disposing a plurality of solder bumps 5 or other conductive adhesive material between the bonding pads 100 and the corresponding conductive pads 40, the semiconductor chip 1 is disposed on the packaging substrate 4 in a face-down manner. Therein, the solder bumps 5 or conductive adhesive material provides electrical I/O and mechanical connection between the semiconductor chip 1 and the packaging substrate 4.

In a conventional flip-chip process, a conductive bump 13 is formed on each of the bonding pads 100 of the semiconductor chip 1 (as shown in FIG. 1B) and a pre-solder bump (not shown) is formed on each of the conductive pads 40 of the packaging substrate 4 for facilitating alignment and connection between the semiconductor chip 1 and the packaging substrate 4. Then, the conductive bumps 13 are reflowed to the corresponding pre-solder bumps to form the solder bumps 5. Thereafter, referring to FIG. 1A, an underfill 6 is provided between the semiconductor chip 1 and the packaging substrate 4 to ensure the reliability of the electrical connection between the semiconductor chip 1 and the packaging substrate 4.

Referring to FIG. 1B, to fabricate the conductive bumps 13, a second insulating layer 12 is formed to cover a wafer 10 so as to protect the wafer 10 from being adversely affected by external environment, and the bonding pads 100 of the wafer 10 are exposed from the second insulating layer 12. Further, a first insulating layer 11 is formed on the second insulating layer 12 and a plurality of openings 110 are formed in the first insulating layer 11 for exposing the bonding pads 100, respectively. Then, a UBM (Under Bump Metallization) layer 131 is formed on the exposed bonding pads 100 and a solder material 134 is formed on the UBM layer 131 so as to form the conductive bumps 13. Subsequently, the wafer 10 is cut into a plurality of semiconductor chips 1 through a singulation process.

However, when reflowing the conductive bumps 13 made of the solder material 134, it is difficult to control the average value and deviation of the volume and height of the conductive bumps 13. If the average value of the volume of the conductive bumps 13 is relatively low such that the amount of the solder material is insufficient, the bonding pads 100 may be not wetted or only partially wetted by the solder material, thereby resulting in poor solder joints and reducing the reliability. On the other hand, if the average value of the volume of the conductive bumps 13 is relatively high such that the amount of the solder material is excessive, solder bridges can easily occur between adjacent solder joints.

Therefore, the deviation of the volume and height of the conductive bumps 13 is large, which not only can easily cause defects of the solder bumps 5 so as to lead to poor electrical connection, but also can easily result in poor coplanarity between the array-arranged solder bumps 5 so as to lead to poor solder joints and product failure. Therefore, the conductive bumps 13 made of the solder material 134 cannot meet the fine-pitch requirement of the semiconductor chip 1.

Accordingly, a flip-chip bump technique is provided. Referring to FIG. 1C, a copper post 132 is formed on the UBM layer 131 and a solder material 134 is further formed on the copper post 132. Since the reflow process does not change the shape of the copper post, the height and volume of the conductive bumps 13' can be easily controlled so as to control the collapse range of the solder bumps 5. Therefore, the semiconductor chip 1 can easily meet the fine-pitch requirement.

However, along with the miniaturization of electronic products, I/O pitches and the size of the conductive bumps 13' are decreasing. Since the copper post 132 has a rigid structure such that stresses of the rigid structure easily concentrate on an interface S between the UBM layer 131 and the first insulating layer 11, delamination can easily occur at the interface S, thus reducing the product reliability.

Therefore, there is a need to provide a conductive bump structure and a fabrication method thereof so as to overcome the above-described drawbacks.

SUMMARY OF THE INVENTION

Accordingly, the present invention provides a conductive bump structure for being formed on a substrate, wherein the substrate has a plurality of bonding pads and a first insulating layer formed thereon and the first insulating layer has a plurality of first openings for exposing the corresponding bonding pads. The conductive bump structure comprises: a metal layer formed on each of the bonding pads exposed through the first openings; a conductive post formed on the metal layer on each of the bonding pads; and a conductive material formed on the conductive post formed on the metal layer on each of the bonding pads, wherein a gap is formed between the conductive post and a wall of the first opening.

The present invention further provides a fabrication method of a conductive bump structure on a substrate, wherein the substrate has a plurality of bonding pads and a first insulating layer formed thereon and the first insulating layer has a plurality of first openings for exposing the corresponding bonding pads. The method comprises the steps of: forming a metal layer on each of the bonding pads; forming a conductive post on the metal layer; and forming a conductive material on the conductive post, wherein a gap is formed between the conductive post and a wall of the first opening.

The above-described method can further comprise: forming a resist layer on the first insulating layer; forming a plurality of openings in the resist layer at a position corresponding to the first openings, wherein each of the openings has a projective width less than a projective width of the first opening; forming the conductive post on the metal layer exposed through the openings; and removing the resist layer.

In the above-described conductive bump structure and the fabrication method thereof, a second insulating layer can further be formed on the substrate in a manner that the first insulating layer is formed on the second insulating layer and the second insulating layer can be formed with a plurality of second openings for exposing the bonding pads. A gap can be formed between the conductive post and a wall of the second opening. The second opening can be less in projective width than the first opening, and the metal layer can be less in projective width than the second opening.

In the above-described conductive bump structure and the fabrication method thereof, a barrier layer can further be formed between the conductive post and the conductive material.

The present invention further provides a conductive bump structure for being formed on a substrate, wherein the substrate has a plurality of bonding pads, a redistribution layer electrically connected to the bonding pads, and an insulating layer having a plurality of openings for exposing the redistribution layer from the insulating layer. The conductive bump structure comprises: a metal layer formed on the redistribution layer exposed from each of the openings; a conductive post formed on the metal layer; and a conductive material formed on the conductive post, wherein a gap is formed between the conductive post and a wall of the opening.

The present invention further provides a fabrication method of a conductive bump structure on a substrate, wherein the substrate has a plurality of bonding pads, a redistribution layer electrically connected to the bonding pads, and an insulating layer formed on the redistribution layer and having a plurality of first openings for exposing the redistribution layer from the insulating layer. The method comprises the steps of: forming a metal layer on the redistribution layer; forming a conductive post on the metal layer; and forming a conductive material on the conductive post, wherein a gap is formed between the conductive post and a wall of the first opening.

The above-described method can further comprise: forming a resist layer on the redistribution layer; forming a plurality of second openings in the resist layer at a position corresponding to the first openings, wherein each of the second openings is less in projective width than the first opening; forming the conductive post on the metal layer exposed through the second openings; and removing the resist layer.

In the above-described conductive bump structure and the fabrication method thereof, the redistribution layer can have at least a dielectric sublayer formed on the substrate and the bonding pads, a circuit sublayer formed on the dielectric sublayer, and a plurality of conductive vias formed in the dielectric sublayer for electrically connecting the circuit sublayer and the bonding pads.

In the above-described conductive bump structure and the fabrication method thereof, a bather layer can further be formed between the conductive post and the conductive material.

According to the present invention, since a gap is formed between the conductive post and the wall of the first opening, no contact occurs between the conductive post and the first insulating layer. As such, the present invention prevents stresses of the conductive post from concentrating on an interface of different materials as in the prior art, thereby avoiding delamination of the conductive bump structure and improving the product reliability.

Further, during a subsequent flip-chip process, the gap between the conductive post and the wall of the first opening allows an underfill to flow into the first opening so as to increase the contact area between the underfill and the semiconductor chip, i.e., strengthen the bonding between the underfill and the first insulating layer, thus preventing delamination of the semiconductor chip and improving the product reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'on', 'a' etc. are only used as a matter of descriptive convenience and not intended to have any other significance or provide limitations for the present invention.

FIGS. 2A to 2D are schematic cross-sectional views showing a fabrication method of a conductive bump structure according to a first embodiment of the present invention. The conductive bump structure 2 is formed on a semiconductor chip 3.

Figure 1A:
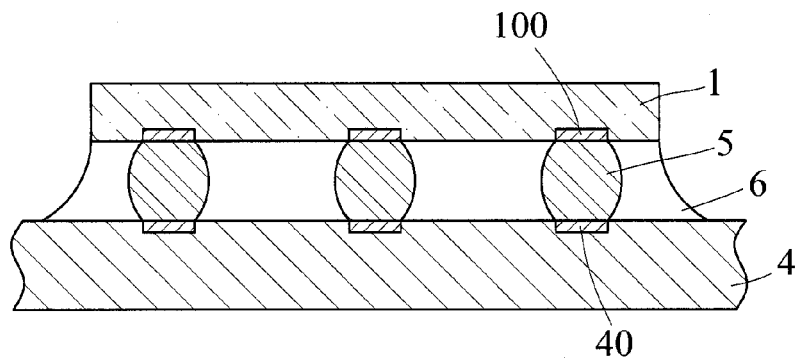
FIG. 1A is a schematic cross-sectional view showing a conventional flip-chip package structure.
Figure 1B:
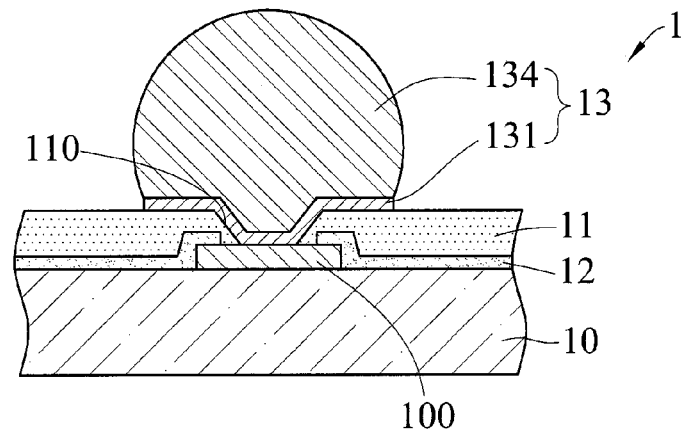
FIGS. 1B and 1C are schematic cross-sectional views showing a conventional semiconductor chip having different conductive bump structures.
Figure 1C:
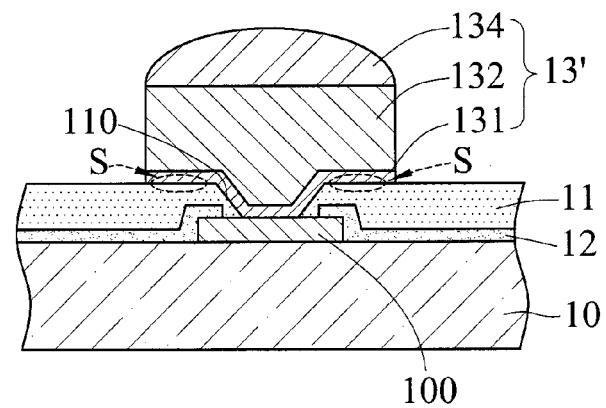
Figure 2A:
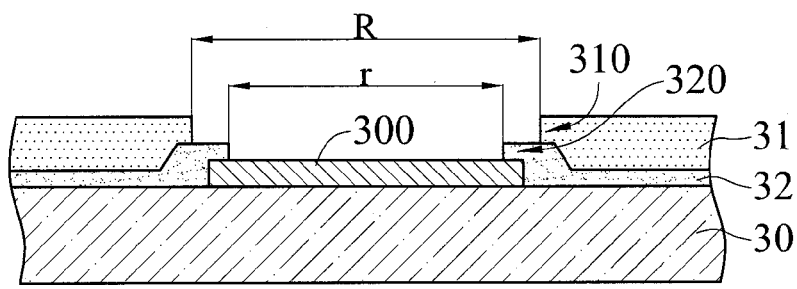
FIGS. 2A to 2E are schematic cross-sectional views showing a fabrication method of a conductive bump structure according to a first embodiment of the present invention.

Referring to FIG. 2A, a second insulating layer 32 is formed on a substrate 30 having a plurality of bonding pads 300, and the second insulating layer 32 has a plurality of second openings 320 for exposing the bonding pads 300.

Then, a first insulating layer 31 is formed on the second insulating layer 32, and a plurality of first openings 310 are formed in the first insulating layer 31 at a position corresponding to the second openings 320 so as to expose the corresponding bonding pads 300.

In the present embodiment, the substrate 30 is a wafer. In other embodiments, the substrate 20 can be a silicon substrate or a glass substrate.

The bonding pads 300 can be made of aluminum. The second insulating layer 32 can be made of SiN or SiOx so as to serve as a passivation layer. The first insulating layer can beC made of polyimide (PI), benezocyclobutene (BCB) or polybenzoxazole (PBO).

The second opening 320 has a projective width r less than a projective width R of the first opening 310.

For purpose of simplification, only a single bonding pad 300 is shown in the drawings. But it should be noted that the present invention is not limited thereto.

Figure 2B:
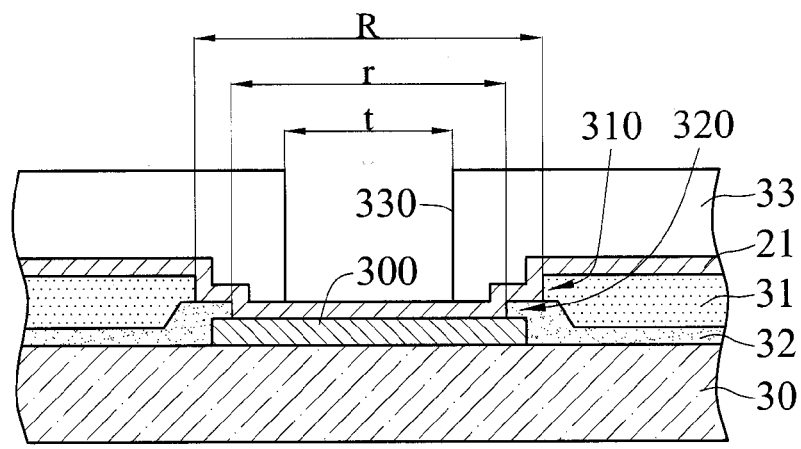

Referring to FIG. 2B, a metal layer 21 is formed on the first insulating layer 31 and the bonding pad 300, and a photoresist layer 33 is formed on the metal layer 21.

Subsequently, through exposure and development, the opening 330 is formed in the photoresist layer 33 at a position corresponding to the first and second openings 310, 320 to thereby expose the metal layer 21 on the bonding pad 300.

In the present embodiment, the opening 330 has a projective width t less than the projective widths R, r of the first and second openings 310, 320.

Further, the metal layer 21 can be used as a current conductive path in a subsequent electroplating process. The metal layer 21 can be, for example but not limited to, made of Ti/Cu or Ti/W/Cu.

Figure 2C:
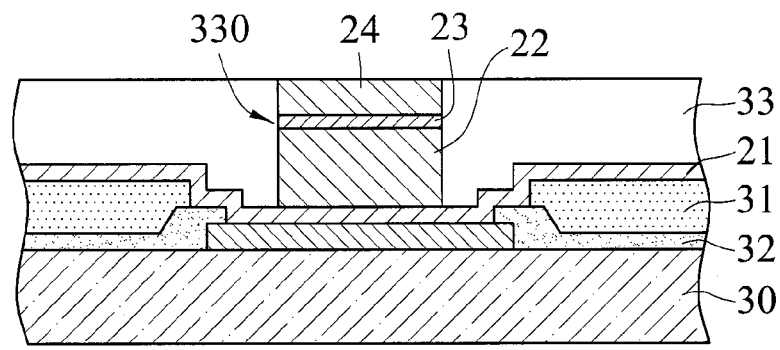

Referring to FIG. 2C, a conductive post 22 is formed on the metal layer 21 in the opening 330 by electroplating, and a bather layer 23 is further formed on the conductive post 22. Subsequently, a conductive material 24 such as a solder material is formed on the bather layer 23.

In the present embodiment, the metal layer 21 can serve as a UBM layer. The conductive post 22 is a copper post. In other embodiment, the conductive post can be made of other metal which has a high melting point preventing collapsing of the conductive post. The bather layer 23 can be, for example but not limited to, made of Ni, Ti/W or Ni/V.

Figure 2D:
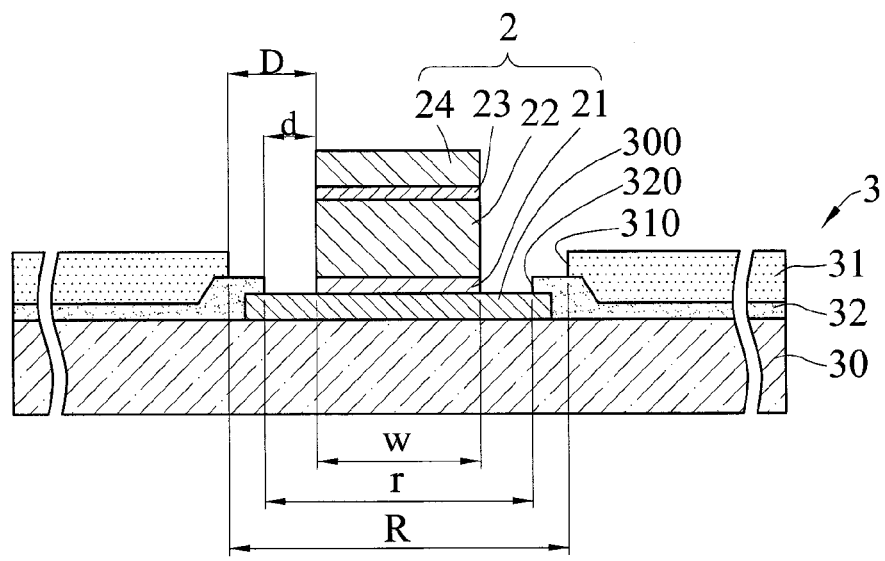

Referring to FIG. 2D, the photoresist layer 33 and the metal layer 21 under the photoresist layer 33 are removed such that the metal layer 21, the conductive post 22, the bather layer 23 and the conductive material 24 form a conductive bump structure 2. Therein, a gap D is formed between the conductive post 22 and a wall of the first opening 310 and a gap d is formed between the conductive post 22 and a wall of the second opening 320. That is, the conductive post 22 has a width w less than the projective widths R, r of the first and second openings 310, 320.

Then, a singulation process is performed to obtain a semiconductor chip 3 having the conductive bump structure 2.

Figure 2E:
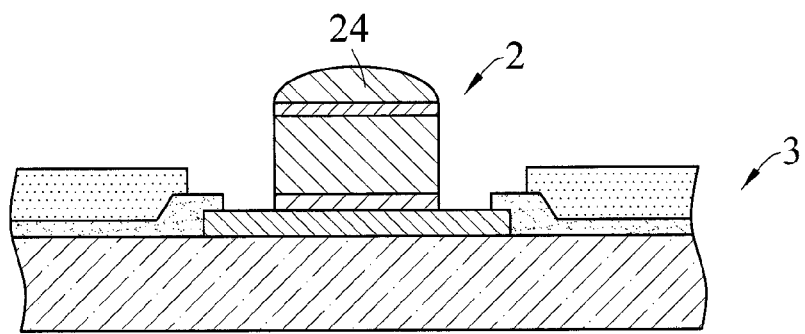

Referring to FIG. 2E, the conductive bump structure 2 is reflowed so as for the conductive material 24 to connect a packaging substrate (not shown) in a flip-chip manner.

According to the above-described fabrication method of the conductive bump structure 2, since the conductive post 22 is spaced from the wall of the first opening 310 by a gap D and spaced from the wall of the second opening 320 by a gap d so as not to come into contact with the first insulating layer 31 or the second insulating layer 32, no interface is formed between the metal layer 21 and the first insulating layer 31 (as well as the second insulating layer 32). Therefore, stresses of the conductive post 22 will concentrate on the bonding pad 300 and the metal layer 21 made of a metal material instead of concentrating on the metal layer 21 and the first insulating layer 31 (and the second insulating layer 32) which is made of a non-metal material, thereby avoiding delamination of the conductive bump structure 2.

Further, since the conductive bump structure 2 is completely exposed through the first and second openings 310, 320 and the second opening 320 has a projective width r less than a projective width R of the first opening 310, a step-shaped opening is formed so as for an underfill to flow therein during a subsequent flip-chip process, thereby increasing the contact area between the underfill and the semiconductor chip 3, i.e., strengthening the bonding between the underfill and the first insulating layer 31 so as to avoid delamination of the semiconductor chip 3.

Therefore, when the semiconductor chip 3 is mounted to the packaging substrate (not shown) in a flip-chip manner so as to form a semiconductor package (not shown), the electrical joints formed between the packaging substrate and the semiconductor chip 3 are capable of withstanding stresses generated therebetween, thus improving the reliability of the semiconductor package.

The present invention further provides a conductive bump structure 2 for being formed on a substrate 30. Therein, the substrate 30 has a plurality of bonding pads 300 and a first insulating layer 31 formed thereon, and the first insulating layer 31 has a plurality of first openings 310 for exposing the corresponding bonding pads 300. The conductive bump structure 2 has: a metal layer 21 formed on each of the bonding pads 300, a conductive post 22 formed on the metal layer 21, a bather layer 23 formed on the conductive post 22, and a conductive material 24 formed on the bather layer 23. Therein, a gap D is formed between the conductive post 22 and a wall of the first opening 310.

The conductive post 22 can be a copper post.

A second insulating layer 32 is further formed between the first insulating layer 31 and the substrate 30 and has a plurality of second openings 320 for exposing the bonding pads 300. Each of the second opening 320 has a projective width r less than a projective width R of the first opening 310. Further, referring to FIG. 2D, the projective width r of the second opening 320 is greater than the width w of the conductive post 22 such that a gap d is formed between the conductive post 22 and a wall of the second opening 320.

FIGS. 3A to 3D are cross-sectional views showing a fabrication method of a conductive bump structure 2 according to a second embodiment of the present invention. A main difference of the present embodiment from the first embodiment is the structure of the semiconductor chip 3', which is detailed as follows.

Figure 3A:
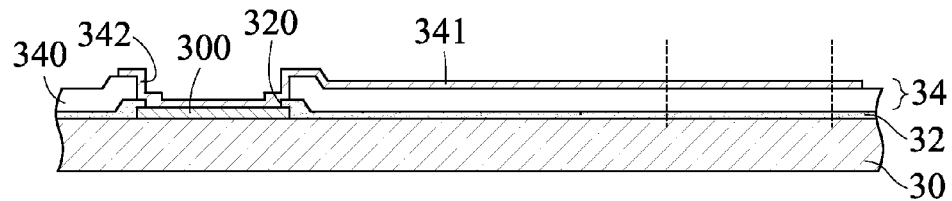
FIGS. 3A to 3D are schematic cross-sectional views showing a fabrication method of a conductive bump structure according to a second embodiment of the present invention.

Referring to FIG. 3A, a substrate 30 having a plurality of bonding pads 300 is provided. A second insulating layer 32 is formed on the substrate 30 and a plurality of second openings 320 are formed in the second insulating layer 32 for exposing the bonding pads 300.

Then, a redistribution layer 34 is formed on the second insulating layer 32 and electrically connected to the bonding pads 300. The redistribution layer 34 has at least a dielectric layer 340 formed on the second insulating layer 32 and the bonding pads 300, a circuit layer 341 formed on the dielectric layer 340, and a plurality of conductive vias 342 formed in the dielectric layer 340 for electrically connecting the circuit layer 341 and the bonding pads 300 exposed from the second openings 320.

In the present embodiment, the bonding pads 300 are made of aluminum. The dielectric layer 340 can be made of polyimide (PI), benezocyclobutene (BCB) or polybenzoxazole (PBO). The circuit layer 341 can be made of Ti/Cu or Ti/W/Cu.

Figure 3B:
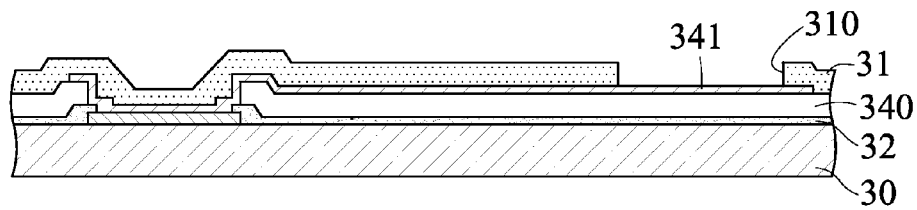

Referring to FIG. 3B, a first insulating layer 31 is formed on the redistribution layer 34, and a plurality of first openings 310 are formed in the first insulating layer 31 for exposing the circuit layer 341 of the redistribution layer 34.

Figure 3C:
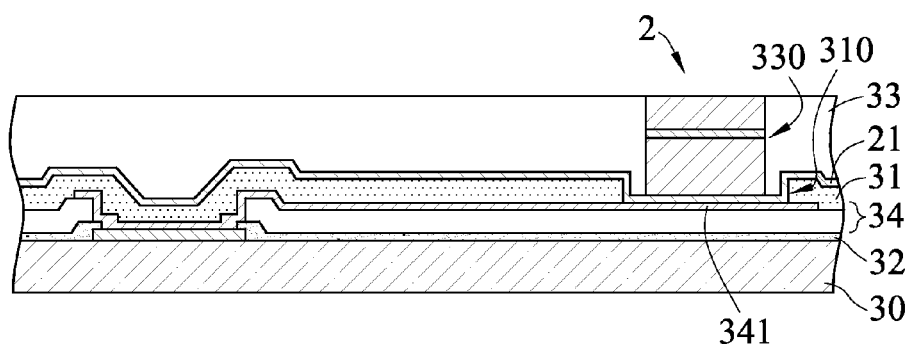

Referring to FIG. 3C, a metal layer 21 is formed on the first insulating layer 31 and the circuit layer 341 of the redistribution layer 34, and a photoresist layer 33 is formed on the metal layer 21.

Further, a plurality of openings 330 are formed in the photoresist layer 33 at a position corresponding to the first openings 310 so as to expose the metal layer 21.

Then, a conductive post 22 is formed on the metal layer 21 in the openings 330 through an electroplating process that uses the metal layer 21 as a current conductive path.

Figure 3D:
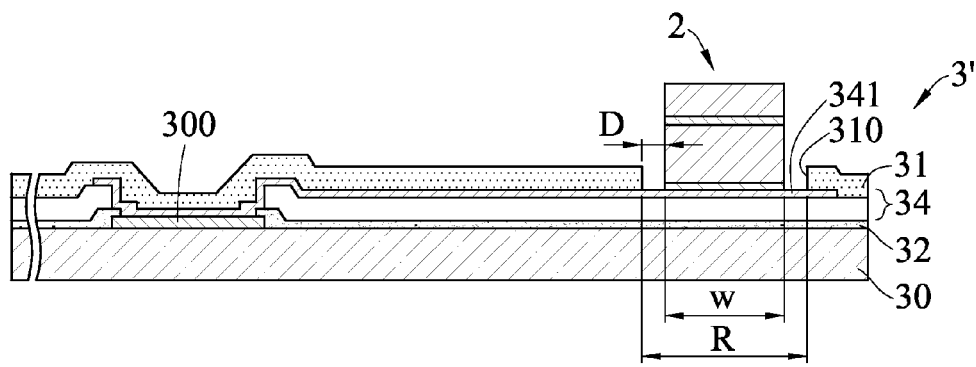

Referring to FIG. 3D, the photoresist layer 33 and the metal layer 21 under the photoresist layer 33 are removed. Therein, a gap D is formed between the conductive post 22 and the first opening 310. That is, the conductive post 22 has a width w less than a projective width R of the first opening 310.

Thereafter, a singulation process is performed to form a semiconductor chip 3' having the conductive bump structure 2.

The present invention further provides a conductive bump structure 2 for being formed on a substrate 30. Therein, the substrate has a plurality of bonding pads 300, a redistribution layer 34 electrically connected to the bonding pads 300, and a first insulating layer 31 formed on the redistribution layer 34 and having a plurality of first openings 310 for exposing the redistribution layer 34 from the first insulating layer 31.

The conductive bump structure 2 has: a metal layer 21 formed on the redistribution layer 34 exposed from each of the first openings 310, a conductive post 22 formed on the metal layer 21, a bather layer 23 formed on the conductive post 22 and a conductive material 24 formed on the bather layer 23. Therein, a gap D is formed between the conductive post 22 and a wall of the first opening 310.

The conductive post 22 can be a copper post.

The redistribution layer 34 has at least a dielectric sublayer 340 formed on the substrate 30 and the bonding pads 300, a circuit sublayer 341 formed on the dielectric sublayer 340, and a plurality of conductive vias 342 formed in the dielectric sublayer 340 for electrically connecting the circuit sublayer 341 and the bonding pads 300.

According to the present invention, since a gap exists between the conductive post and a wall of the first opening, no contact occurs between the conductive post and the first insulating layer. As such, the present invention prevents stresses of the conductive post from concentrating on an interface of different materials as in the prior art, thereby avoiding delamination of the conductive bump structure and improving the product reliability.

Further, since the conductive post is completely exposed from the first opening (and the second opening), an underfill can flow into the first opening (and the second opening) during a subsequent flip-chip process so as to increase the contact area between the underfill and the semiconductor chip, i.e., strengthen the bonding between the underfill and the first insulating layer, thereby preventing delamination of the semiconductor chip and improving the product reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a conductive bump structure on a substrate, the substrate having a plurality of bonding pads, and a first insulating layer and a second insulating layer formed thereon, wherein the first insulating layer is formed on the second insulating layer, the first insulating layer has a plurality of first openings for exposing the corresponding bonding pads, and the second insulating layer is formed with a plurality of second openings for exposing the bonding pads, the method comprising the steps of:
   forming a metal layer on each of the bonding pads;
   forming a conductive post on the metal layer; and
   forming a conductive material on the conductive post, wherein a gap is formed between the conductive post and a wall of the first opening, and another gap is formed between the conductive post and a wall of the second opening.

2. The method of claim 1, further comprising:
   forming a resist layer on the first insulating layer;
   forming a plurality of openings in the resist layer at a position corresponding to the first openings, wherein each of the openings has a projective width less than a projective width of the first opening;
   forming the conductive post on the metal layer exposed through the openings; and
   removing the resist layer.

3. The method of claim 1, wherein the second opening is less in projective width than the first opening.

4. The method of claim 1, wherein the metal layer is less in projective width than the second opening.

5. The method of claim 1, further comprising forming a barrier layer between the conductive post and the conductive material.

6. A conductive bump structure for being formed on a substrate, the substrate having a plurality of bonding pads, and a first insulating layer and a second insulating layer formed thereon, wherein the first insulating layer is formed on the second insulating layer, the first insulating layer has a plurality of first openings for exposing the corresponding bonding pads, and the second insulating layer is formed with a plurality of second openings for exposing the bonding pads, the conductive bump structure comprising:
   a metal layer formed on the bonding pads exposed through the first openings;
   a conductive post formed on the metal layer on the bonding pads; and
   a conductive material formed on the conductive post and the metal layer on each of the bonding pads, wherein a gap is formed between the conductive post and a wall of the first opening, and another gap is formed between the conductive post and a wall of the second opening.

7. The structure of claim 6, wherein the second opening is less in projective width than the first opening.

8. The structure of claim 6, wherein the metal layer is less in projective width than the second opening.

9. The structure of claim 6, further comprising a barrier layer formed between the conductive post and the conductive material.

* * * * *